(12) United States Patent
Yeh et al.

(10) Patent No.: US 12,334,916 B2
(45) Date of Patent: Jun. 17, 2025

(54) SIGNAL CONVERTING CIRCUIT AND BIAS VOLTAGE GENERATION CIRCUIT THEREOF

(71) Applicant: Realtek Semiconductor Corporation, Hsinchu (TW)

(72) Inventors: Chien-Tsu Yeh, Hsinchu (TW); Hsi-En Liu, Hsinchu (TW); Yi-Chun Hsieh, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 57 days.

(21) Appl. No.: 18/173,787

(22) Filed: Feb. 24, 2023

(65) Prior Publication Data
US 2023/0291398 A1 Sep. 14, 2023

(30) Foreign Application Priority Data
Mar. 9, 2022 (TW) .................................. 111108668

(51) Int. Cl.
*H03K 17/14* (2006.01)
*H03K 5/00* (2006.01)
*H03K 5/01* (2006.01)

(52) U.S. Cl.
CPC ............... *H03K 17/14* (2013.01); *H03K 5/01* (2013.01); *H03K 2005/00286* (2013.01)

(58) Field of Classification Search
CPC . H03K 17/14; H03K 5/01; H03K 2005/00286
See application file for complete search history.

(56) References Cited

U.S. PATENT DOCUMENTS

2014/0125394 A1 5/2014 Hood et al.
2016/0191041 A1 6/2016 Chung

*Primary Examiner* — Menatoallah Youssef
*Assistant Examiner* — Colleen J O Toole
(74) *Attorney, Agent, or Firm* — CKC & Partners Co., LLC

(57) ABSTRACT

The present disclosure provides a signal converting circuit including a phase interpolator circuit and a bias voltage generation circuit. The phase interpolator circuit is configured to convert multiple input clock signals into an output clock signal according to a digital signal. The bias voltage generation circuit is electrically coupled to the phase interpolator circuit, is configured to generate a bias voltage according to reference information and is configured to output the bias voltage to the phase interpolator circuit, so that the output clock signal has a predetermined phase corresponding to one of multiple bit configurations of the digital signal. The reference information is relevant to a change of the phase interpolator circuit due to a manufacture process variation.

18 Claims, 4 Drawing Sheets

SIGNAL CONVERTING CIRCUIT AND BIAS VOLTAGE GENERATION CIRCUIT THEREOF

CROSS-REFERENCE TO RELATED APPLICATIONS

This application claims priority to Taiwan Application Serial Number 111108668, filed Mar. 9, 2022, which is herein incorporated by reference in its entirety.

BACKGROUND

Field of Invention

The present disclosure relates to a circuit. More particularly, the present disclosure relates to a signal converting circuit and a bias voltage generation circuit thereof.

Description of Related Art

The phase interpolator in the related art has poor linearity due to the influences of manufacture process variations, which result in many limitations in their applications. Therefore, it is necessary to improve the phase interpolator in the related art to resolve the existing problem.

SUMMARY

One aspect of the present disclosure provides a signal converting circuit. The signal converting circuit includes a phase interpolator circuit and a bias voltage generation circuit. The phase interpolator circuit is configured to convert multiple input clock signals into an output clock signal according to a digital signal. The bias voltage generation circuit is electrically coupled to the phase interpolator circuit, is configured to generate a bias voltage according to reference information, and is configured to output the bias voltage to the phase interpolator circuit, so that the output clock signal has a predetermined phase corresponding to one of multiple bit configurations of the digital signal. The reference information is relevant to a change of the phase interpolator circuit due to a manufacture process variation.

Another aspect of the present disclosure provides a bias voltage generation circuit. The bias voltage generation circuit is configured to provide a bias voltage to a phase interpolator circuit so that an output clock signal outputted by the phase interpolator circuit according to a digital signal has a predetermined phase corresponding to one of multiple bit configurations of the digital signal. The bias voltage generation circuit includes a reference circuit and a current source. The reference circuit is configured to generate reference information relevant to a change of the phase interpolator circuit due to a manufacture process variation. The current source is configured to provide a predetermined current to the reference circuit, so that the bias voltage is generated according to the reference information and the predetermined current.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DESCRIPTION OF THE EMBODIMENTS

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more components are directly in physical or electrical contact, or are indirectly in physical or electrical contact with each other. It can also mean that two or more components interact with each other.

For convenience of descriptions, indexes 1-$n$ in reference labels of components used in the specification and drawings of this application are only for convenience of referring to respective components and are not intended to restrict the amount of components to any specific number. In the specification and drawings of this application, if a reference label of a particular component is used without the index, it means that the reference label of the particular component refers to any unspecific component of corresponding component group. For example, the reference label TP[1] refers to the transistor pair TP[1], and the reference label TP refers to any unspecific transistor pair of the transistor pairs TP[1]-TP[$n$].

Figure 1:
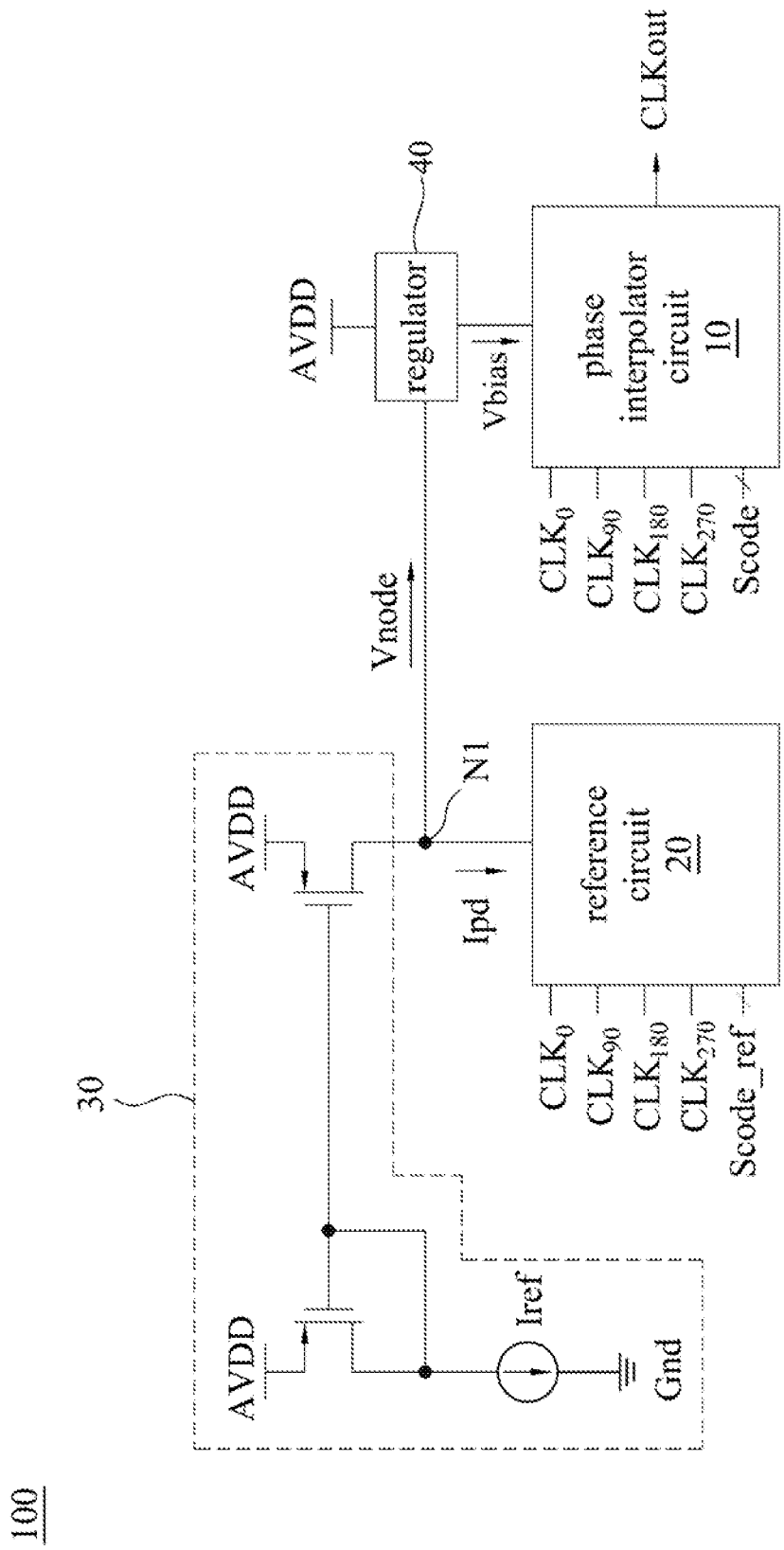
FIG. 1 is a schematic diagram of a signal converting circuit according to some embodiments of the present disclosure.

Referring to FIG. 1, FIG. 1 is a schematic diagram of a signal converting circuit 100 according to some embodiments of the present disclosure. The signal converting circuit 100 includes a phase interpolator circuit 10 and a bias voltage generation circuit. In some embodiments, as shown in FIG. 1, the bias voltage generation circuit includes a reference circuit 20, a current mirror circuit 30 (that is, a current source), and a regulator 40. As for the structure, the reference circuit 20 and the current mirror circuit 30 are coupled at a node N1, and the regulator 40 is coupled between the node N1, a system high voltage AVDD, and the phase interpolator circuit 10. In some embodiments, the regulator 40 may be a low-dropout regulator (LDO).

In the embodiments of FIG. 1, the bias voltage generation circuit can provide a bias voltage Vbias to the phase interpolator circuit 10 through the regulator 40, and the phase interpolator circuit 10 is configured to convert multiple input clock signals $CLK_0$, $CLK_{90}$, $CLK_{180}$ and $CLK_{270}$ into an output clock signal CLKout according to a digital signal Scode. The structure and operation of the phase interpolator circuit 10 is described in detail below with reference to FIG. 2.

Figure 2:
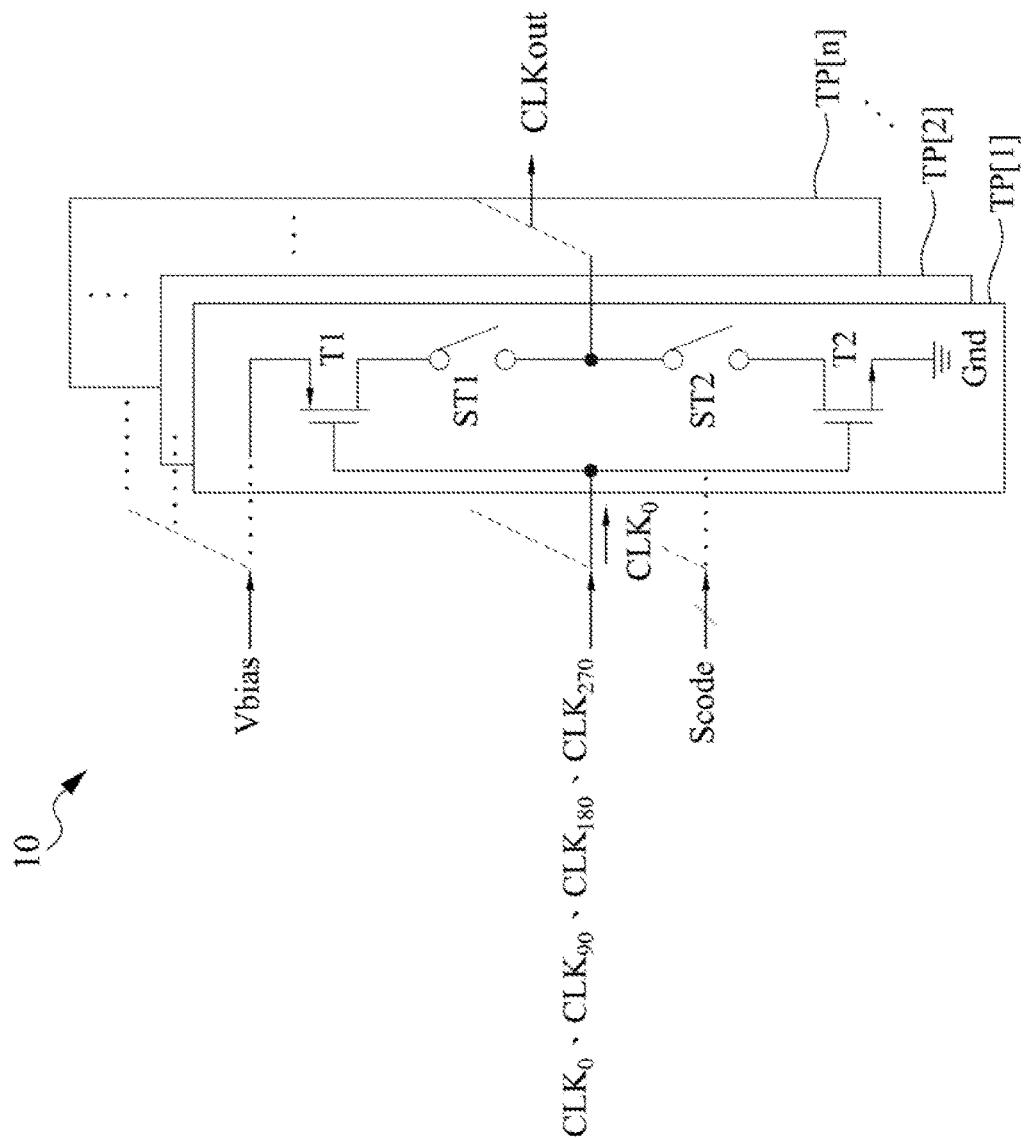
FIG. 2 is a schematic diagram of a phase interpolator circuit according to some embodiments of the present disclosure.

Referring to FIG. 2, FIG. 2 is a schematic diagram of the phase interpolator circuit 10 according to some embodiments of the present disclosure. In some embodiments, as shown in FIG. 2, the phase interpolator circuit 10 includes multiple transistor pairs TP[1]-TP[n] connected in parallel between the bias voltage Vbias and a ground voltage Gnd, in which n is a positive integer greater than 1. In some embodiments, the multiple transistor pairs TP[1]-TP[n] are divided into multiple groups, and each group of transistor pairs is configured to receive one of the multiple input clock signals $CLK_0$, $CLK_{90}$, $CLK_{180}$ and $CLK_{270}$ correspondingly.

In greater detail, the input clock signal $CLK_0$ represents a clock signal with a phase of 0 degree, the input clock signal $CLK_{90}$ represents a clock signal with a phase of 90 degrees, the input clock signal $CLK_{180}$ represents a clock signal in with a phase of 180 degrees, and the input clock signal $CLK_{270}$ represents a clock signal with a phase of 270 degrees. In other words, the phases of the multiple input clock signals $CLK_0$, $CLK_{90}$, $CLK_{180}$ and $CLK_{270}$ inputted to the phase interpolator circuit 10 are different from one another.

In some practical applications, the phase interpolator circuit 10 includes 32 transistor pairs TP[1]-TP[32], and they are divided into 4 groups. In other words, multiple transistor pairs TP[1]-TP[8] are one group, multiple transistor pairs TP[9]-TP[16] are one group, multiple transistor pairs TP[17]-TP[24] are one group, and multiple transistor pairs TP[25]-TP[32] are one group. The multiple transistor pairs TP[1]-TP[8] receive the input clock signal $CLK_0$, the multiple transistor pairs TP[9]-TP[16] receive the input clock signal $CLK_{90}$, the multiple transistor pairs TP[17]-TP[24] receive the input clock signal $CLK_{180}$, and the multiple transistor pairs TP[25]-TP[32] receive the input clock signal $CLK_{270}$.

In some embodiments, structures of the multiple transistor pairs TP[1]-TP[n] are the same. The structure of the transistor pair TP is described below by taking the transistor pair TP[1] for example. As shown in FIG. 2, the transistor pair TP[1] includes a first transistor T1, a second transistor T2, a first switch ST1, and a second switch ST2. A first terminal (such as a source terminal) of the first transistor T1 receives the bias voltage Vbias, a first terminal (such as a source terminal) of the second transistor T2 receives the ground voltage Gnd, and a control terminal (such as a gate terminal) of the first transistor T1 and a control terminal (such as a gate terminal) of the second transistor T2 receive the input clock signal $CLK_0$ (or one of the multiple input clock signals $CLK_0$, $CLK_{90}$, $CLK_{180}$ and $CLK_{270}$). The first switch ST1 and the second switch ST2 are connected in series and are then coupled between a second terminal (such as a drain terminal) of the first transistor T1 and a second terminal (such as a drain terminal) of the second transistor T2. It should be understood that the first transistor T1 may be a P-type metal oxide semiconductor field effect transistor, and the second transistor T2 may be an N-type metal oxide semiconductor field effect transistor.

In some embodiments, the digital signal Scode has multiple bits, and an amount of the bits of the digital signal Scode is the same as an amount of the multiple transistor pairs TP[1]-TP[n]. Each of the multiple transistor pairs TP[1]-TP[n] receives one of the multiple bits of the digital signal Scode correspondingly. For example, the transistor pair TP[1] receives a first bit of the digital signal Scode, the transistor pair TP[2] receives a second bit of the digital signal Scode. In greater detail, each of the bits of the digital signal Scode has a logic value. Accordingly, the first switch ST1 and the second switch ST2 in the transistor pair TP[1] can be selectively turned on according to the logic value (that is, logic "0" or logic "1") of the first bit of the digital signal Scode. In the embodiments of FIG. 2, the first switch ST1 and the second switch ST2 in the transistor pair TP[1] are turned on or turned off at the same time. The operations of the switches in the other transistors pairs TP[2]-TP[n] can be deduced by analogy, so a description in this regard is not repeated here.

It should be understood that the digital signal Scode may have multiple bit configurations, and the multiple bit configurations respectively represent different combinations of the multiple bits of the digital signal Scode. In some practical applications, the digital signal Scode has 32 bits, and is constituted by 8 logic "1" and 24 logic "0". For example, at one time point, the first bit to an eighth bit of the digital signal Scode are logic "1", and a ninth bit to a thirty-second bit of the digital signal Scode are logic "0", which is one of the bit configurations of the digital signal Scode. Since the other bit configurations of the digital signal Scode can be deduced by analogy, a description in this regard is not provided here.

In some embodiments, the digital signal Scode can have a specific bit configuration (that is, one of the multiple bit configurations of the digital signal Scode) after being controlled by an operator. The multiple transistor pairs TP[1]-TP[n] in the phase interpolator circuit 10 perform interpolation on the multiple input clock signals $CLK_0$, $CLK_{90}$, $CLK_{180}$, $CLK_{270}$ according to the digital signal Scode having the specific bit configuration to synthesize the output clock signal CLKout. Theoretically, the output clock signal CLKout generated by the phase interpolator circuit 10 according to the digital signal Scode should have a specific phase (that is, a phase predetermined by the operator) corresponding to the specific bit configuration. In other words, the digital signal Scode having different bit configurations should correspond to the output clock signal CLKout having different phases, respectively. However, in practice the phase interpolator circuit 10 is frequently affected due to a manufacture process variation, which causes the output clock signal CLKout not to have the phase predetermined by the operator.

Notably, by using the bias voltage Vbias provided by the bias voltage generation circuit, an error generated by the phase interpolator circuit 10 due to the manufacture process variation can be corrected, so that the output clock signal CLKout outputted by the phase interpolator circuit 10 can have a predetermined phase corresponding to one of the multiple bit configurations of the digital signal Scode. It should be understood that the predetermined phase may be any phase between 0 and 360 degrees. In the following, the generation of the bias voltage Vbias is described in detail.

In some embodiments, the above bias voltage generation circuit generates the appropriate bias voltage Vbias according to reference information (not shown) generated by the reference circuit 20. In the embodiments of FIG. 1, the reference circuit 20 is a replicated circuit of the phase interpolator circuit 10, that is, the circuit structure of the reference circuit 20 is substantially the same as that of the phase interpolator circuit 10. For example, the reference circuit 20 includes multiple transistor pairs (not shown)

connected in parallel. In order to reflect the change of the phase interpolator circuit 10 due to the manufacture process variation, the multiple transistor pairs of the reference circuit 20 are also divided into multiple groups according to the same grouping method as the multiple transistor pairs TP[1]-TP[n], so as to respectively receive the multiple input clock signals $CLK_0$, $CLK_{90}$, $CLK_{180}$ and $CLK_{270}$ as shown in FIG. 1.

In addition, the reference circuit 20 further receives a reference digital signal Scode_ref similar to the digital signal Scode. In some embodiments, an amount of bits of the reference digital signal Scode_ref is the same as an amount of bits of the digital signal Scode, but the reference digital signal Scode_ref is set to have only one fixed bit configuration (that is, a predetermined bit configuration). The predetermined bit configuration of the reference digital signal Scode_ref may be one of the multiple bit configurations of the digital signal Scode. It can be appreciated that the predetermined bit configuration of the reference digital signal Scode_ref includes multiple bits, and each of the multiple transistor pairs of the reference circuit 20 receives one of the multiple bits of the reference digital signal Scode_ref correspondingly.

As shown in FIG. 1, the reference circuit 20 receives the multiple input clock signals $CLK_0$, $CLK_{90}$, $CLK_{180}$, $CLK_{270}$ and the reference digital signal Scode_ref. However, a synthesized clock signal may not be outputted because the reference circuit 20 receives the above multiple signals to only reflect the change of the phase interpolator circuit 10 due to the manufacture process variation. Additionally, under the circumstances of receiving the reference digital signal Scode_ref and not outputting the synthesized clock signal, the power consumption of the reference circuit 20 can be reduced.

It can be appreciated that a rise time or a fall time of the internal transistors of the reference circuit 20 may become longer or shorter due to the manufacture process variation, which further affects a magnitude of an equivalent resistance of the reference circuit 20. In some embodiments, the equivalent resistance of the reference circuit 20 includes the following components: (1) a resistance error caused by the manufacture process variation; and (2) an ideal resistance set by the predetermined bit configuration of the reference digital signal Scode_ref (that is, the ideal resistance is the resistance caused by the transistor pair in the reference circuit 20 in which the first switch ST1 and the second switch ST2 are turned on without considering the manufacture process variation). The above reference information is the equivalent resistance that the reference circuit 20 has due to the manufacture process variation. In greater detail, since the reference circuit 20 and the phase interpolator circuit 10 are manufactured with the same manufacture process, the reference information provided by the reference circuit 20 is relevant to the change of the phase interpolator circuit 10 due to the manufacture process variation.

As shown in FIG. 1, the current mirror circuit 30 can generate a predetermined current Ipd to the reference circuit 20 according to a reference current Iref, so as to generate a node voltage Vnode at the node N1. In the embodiments of FIG. 1, the node voltage Vnode is equal to the equivalent resistance of the reference circuit 20 multiplied by the predetermined current Ipd. Then, the regulator 40 can receive and stabilize the node voltage Vnode to generate the bias voltage Vbias to the phase interpolator circuit 10.

Notably, since the reference circuit 20 and the phase interpolator circuit 10 are manufactured with the same manufacture process, the above-mentioned bias voltage Vbias generated by the bias voltage generation circuit according to the equivalent resistance of the reference circuit 20 and the predetermined current Ipd will have a voltage magnitude capable of compensating for the manufacture process variation of the phase interpolator circuit 10. For example, if the rise time or the fall time of the internal transistors of the phase interpolator circuit 10 (and/or the reference circuit 20) becomes shorter due to the manufacture process variation, the equivalent resistance of the reference circuit 20 is relatively small. Since a magnitude of the predetermined current Ipd is fixed, the above bias voltage generation circuit will generate the small bias voltage Vbias to the phase interpolator circuit 10 according to the small node voltage Vnode, so as to lengthen the rise time or the fall time of the internal transistors of the phase interpolator circuit 10. For another example, if the rise time or the fall time of the internal transistors of the phase interpolator circuit 10 (and/or the reference circuit 20) becomes longer due to the manufacture process variation, the equivalent resistance of the reference circuit 20 is relatively large. Since the magnitude of the predetermined current Ipd is fixed, the above bias voltage generation circuit will generate the large bias voltage Vbias to the phase interpolator circuit 10 according to the large node voltage Vnode, so as to shorten the rise time or the fall time of the internal transistors of the phase interpolator circuit 10. By correcting the bias voltage of the phase interpolator circuit 10, the phase interpolator circuit 10 can generate the output clock signal CLKout having the predetermined phase corresponding to one of the multiple bit configurations of the digital signal Scode.

In the above embodiments, the bias voltage generation circuit generates the bias voltage Vbias by stabilizing the node voltage Vnode through the regulator 40, however, the present disclosure is not limited in this regard. It can be seen from the foregoing that the node voltage Vnode and the bias voltage Vbias are positively correlated. Hence, in some embodiments, the regulator 40 may be omitted and the above bias voltage generation circuit directly uses the node voltage Vnode as the bias voltage Vbias and outputs it to the phase interpolation 10.

In the above embodiments, FIG. 1 only shows the one output clock signal CLKout, however, the present disclosure is not limited in this regard. In other embodiments, the phase interpolator circuit 10 can generate two output clock signals that differ from each other by a specific phase (such as a 180-degree phase, a 90-degree phase). In other words, the phase interpolator circuit 10 of the present disclosure can generate at least one output clock signal.

Figure 3A:
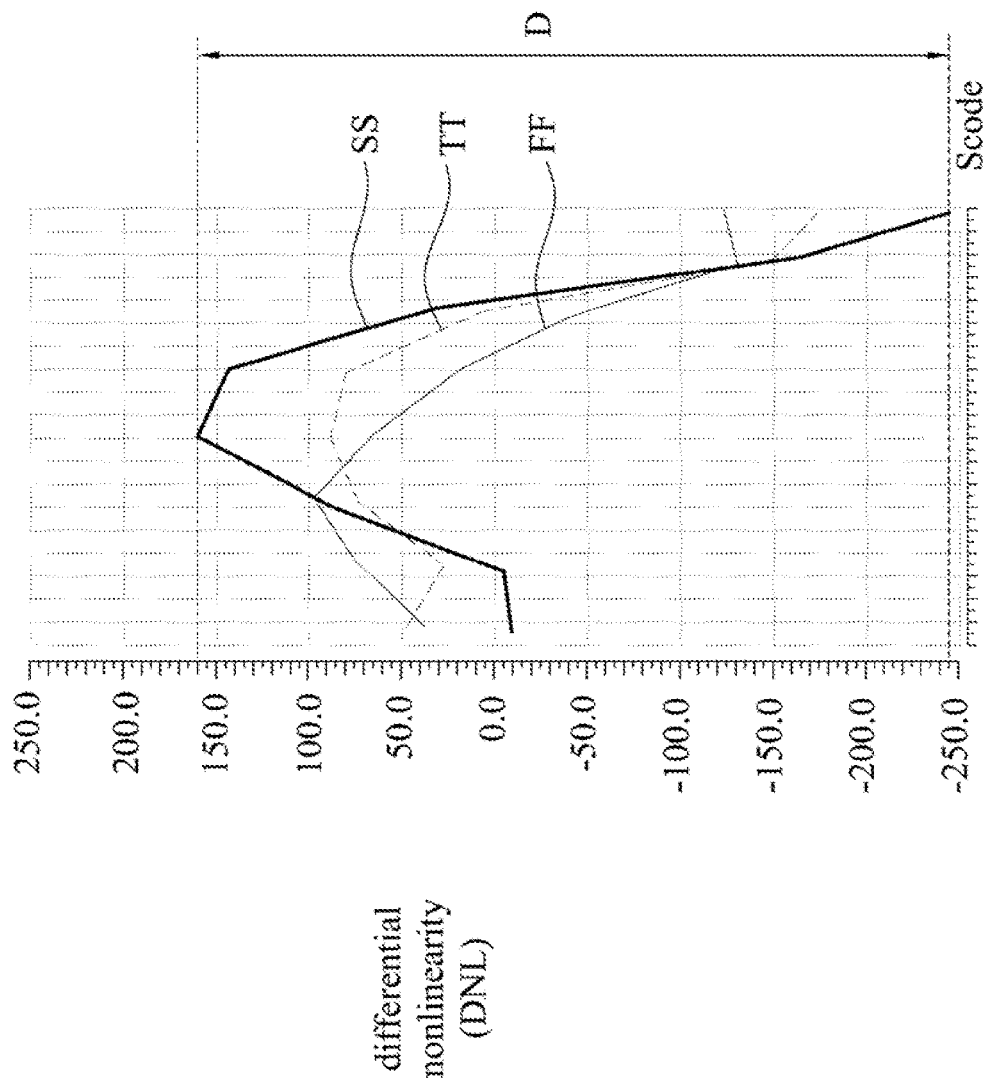
FIG. 3A is a diagram of experimental data of a phase interpolator circuit with an uncorrected bias voltage according to some embodiments of the present disclosure.
Figure 3B:
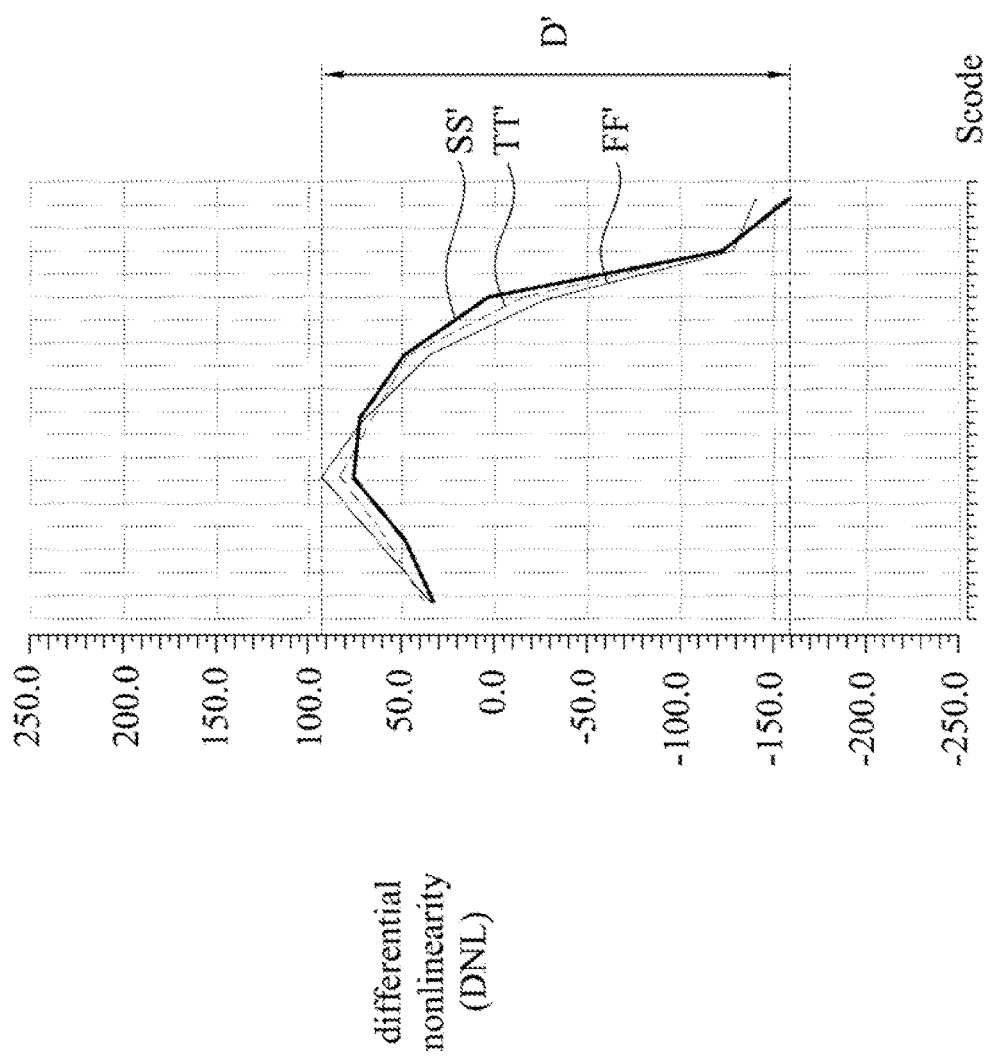
FIG. 3B is a diagram of experimental data of a phase interpolator circuit receiving a bias voltage provided by a bias voltage generation circuit according to some embodiments of the present disclosure.

Referring to FIG. 3A and FIG. 3B. FIG. 3A is a diagram of experimental data of the phase interpolator circuit 10 with an uncorrected bias voltage according to some embodiments of the present disclosure, and FIG. 3B is a diagram of experimental data of the phase interpolator circuit 10 receiving the bias voltage Vbias provided by a bias voltage generation circuit according to some embodiments of the present disclosure. In FIG. 3A and FIG. 3B, the multiple scales on the horizontal axis respectively represent the multiple bit configurations of the digital signal Scode, and the multiple scales on the vertical axis respectively represent magnitudes of differential nonlinearity (DNL). It can be appreciated that the smaller the differential nonlinearity is, the higher the linearity of the converting circuit is. Therefore, in an ideal converting circuit the differential nonlinearity is close to zero.

As shown in FIG. 3A, the three curves FF (fast-fast), TT (typical-typical), and SS (slow-slow) respectively represent the experimental data under three different manufacture process variations, while a vertical axis range D represents the magnitude distribution of the differential nonlinearities of the phase interpolator circuit 10 with the uncorrected bias voltage. As shown in FIG. 3B, the three curves FF', TT', and SS' respectively represent the experimental data under the three different manufacture process variations, while a vertical axis range D' represents the magnitude distribution of the differential nonlinearities of the phase interpolator circuit 10 receiving the bias voltage Vbias. As can be seen from FIG. 3A and FIG. 3B, the phase interpolator circuit 10 receiving the bias voltage Vbias has a better linearity in comparison with the phase interpolator circuit 10 with the uncorrected bias voltage. For example, the vertical axis range D' in FIG. 3B is reduced by about 37% in comparison with the vertical axis range D in FIG. 3A.

It can be seen from the embodiments of the present disclosure that, by compensating the phase interpolator circuit with the appropriate bias voltage generated according to the reference information relevant to the change of the phase interpolator circuit due to the manufacture process variation, the signal converting circuit of the present disclosure has the advantage of improved linearity.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A signal converting circuit comprising:
  a phase interpolator circuit configured to convert a plurality of input clock signals into an output clock signal according to a digital signal; and
  a bias voltage generation circuit comprising a reference circuit, wherein the reference circuit is a replicated circuit of the phase interpolator circuit, and the bias voltage generation circuit is electrically coupled to the phase interpolator circuit, configured to generate a bias voltage according to reference information and configured to output the bias voltage to the phase interpolator circuit, so that the output clock signal has a predetermined phase corresponding to one of a plurality of bit configurations of the digital signal;
  wherein the reference information is relevant to a change of the phase interpolator circuit due to a manufacture process variation, and the reference information is an equivalent resistance of the reference circuit due to the manufacture process variation.

2. The signal converting circuit of claim 1, wherein the phase interpolator circuit comprises a plurality of transistor pairs connected in parallel, and the plurality of transistor pairs each is configured to receive a corresponding bit of a plurality of bits of the digital signal;
  wherein the plurality of transistor pairs are divided into a plurality of groups, and each group of transistor pairs is configured to receive a corresponding input clock signal of the plurality of input clock signals.

3. The signal converting circuit of claim 2, wherein phases of the plurality of input clock signals are different from one another.

4. The signal converting circuit of claim 2, wherein the plurality of transistor pairs each comprises a first transistor, a second transistor, a first switch and a second switch:
  wherein a first terminal of the first transistor receives the bias voltage, a first terminal of the second transistor receives a ground voltage, a control terminal of the first transistor and a control terminal of the second transistor receive the corresponding input clock signal of the plurality of input clock signals;
  wherein the first switch and the second switch are connected in series and are then coupled between a second terminal of the first transistor and a second terminal of the second transistor, and are configured to be selectively turned on according to the corresponding bit of the plurality of bits of the digital signal.

5. The signal converting circuit of claim 4, wherein the first transistor is a P-type metal oxide semiconductor field effect transistor, and the second transistor is an N-type metal oxide semiconductor field effect transistor.

6. The signal converting circuit of claim 1, wherein the bias voltage generation circuit generates the bias voltage according to the equivalent resistance and a predetermined current inputted to the reference circuit.

7. The signal converting circuit of claim 6, wherein the reference circuit is configured to receive the plurality of input clock signals and a reference digital signal, wherein an amount of bits of the reference digital signal is the same as an amount of bits of the digital signal.

8. The signal converting circuit of claim 7, wherein the reference circuit comprises a plurality of transistor pairs connected in parallel, the plurality of transistor pairs are divided into a plurality of groups, and each group of transistor pairs is configured to receive a corresponding input clock signal of the plurality of input clock signals correspondingly;
  wherein the plurality of transistor pairs each is configured to receive a corresponding bit of the bits of the reference digital signal.

9. The signal converting circuit of claim 6, wherein the bias voltage generation circuit further comprises a current mirror circuit, the current mirror circuit and the reference circuit are coupled at a node, and the current mirror circuit is configured to generate the predetermined current to the reference circuit according to a reference current so as to generate a node voltage at the node.

10. The signal converting circuit of claim 9, wherein the bias voltage generation circuit further comprises a regulator, the regulator is coupled between the node and the phase interpolator circuit, and is configured to receive and stabilize the node voltage so as to generate the bias voltage to the phase interpolator circuit.

11. A bias voltage generation circuit configured to provide a bias voltage to a phase interpolator circuit so that an output clock signal outputted by the phase interpolator circuit according to a digital signal has a predetermined phase corresponding to one of a plurality of bit configurations of the digital signal, wherein the bias voltage generation circuit comprises:
  a reference circuit configured to generate reference information relevant to a change of the phase interpolator circuit due to a manufacture process variation, wherein the reference information is an equivalent resistance of the reference circuit due to the manufacture process variation, and the reference circuit is a replicated circuit of the phase interpolator circuit; and a current source configured to provide a predetermined current to the reference circuit, so that the bias voltage is generated according to the reference information and the predetermined current.

12. The bias voltage generation circuit of claim 11, wherein the reference circuit configured to receive a reference digital signal, wherein the reference digital signal has a predetermined bit configuration, and the predetermined bit configuration is the same as one of the plurality of bit configurations of the digital signal.

13. The bias voltage generation circuit of claim 12, wherein the predetermined bit configuration of the reference digital signal comprises a plurality of bits, the reference circuit comprises a plurality of transistor pairs connected in parallel, and the plurality of transistor pairs each is configured to receive a corresponding bit of the plurality of bits of the reference digital signal.

14. The bias voltage generation circuit of claim 13, wherein the transistor pairs are divided into a plurality of groups, and each group of transistor pairs is configured to receive a corresponding input clock signal of a plurality of input clock signals.

15. The bias voltage generation circuit of claim 14, wherein phases of the plurality of input clock signals are different from one another.

16. The bias voltage generation circuit of claim 11, wherein the current source and the reference circuit are coupled at a node, and the predetermined current flows into the reference circuit so that a node voltage is generated at the node.

17. The bias voltage generation circuit of claim 16, wherein the bias voltage generation circuit further comprises a regulator, the regulator is coupled to the node and is configured to receive and stabilize the node voltage so as to generate the bias voltage to the phase interpolator circuit.

18. The bias voltage generation circuit of claim 11, wherein the current source is a current mirror circuit, and the current mirror circuit is configured to generate the predetermined current to the reference circuit according to a reference current.

* * * * *